United States Patent [19]
Thorpe

[11] 4,378,521
[45] Mar. 29, 1983

[54] ACTIVE ZENER DIODE SUBSTITUTE CIRCUIT

[75] Inventor: Richard W. Thorpe, Claremont, Calif.

[73] Assignee: General Dynamics, Pomona Division, Pomona, Calif.

[21] Appl. No.: 311,489

[22] Filed: Oct. 15, 1981

[51] Int. Cl.³ .......................................... H03K 5/08
[52] U.S. Cl. .............................. 323/229; 323/231; 307/494; 307/551; 307/565
[58] Field of Search ....................... 323/229, 231, 220; 307/494, 549, 551, 565, 566

[56] References Cited

U.S. PATENT DOCUMENTS

| | | | |
|---|---|---|---|
| 3,153,152 | 10/1964 | Hoffman, Jr. | 307/88.5 |
| 3,166,720 | 1/1965 | Rosen et al. | 330/110 |
| 3,237,002 | 2/1966 | Patmore | 235/184 |
| 3,248,569 | 4/1966 | Weekes | 307/88.5 |
| 3,268,830 | 8/1966 | Ragsdale | 330/110 |
| 3,327,131 | 6/1967 | Grimmer | 307/88.5 |
| 3,404,348 | 10/1968 | Hansen et al. | 330/103 |
| 3,851,259 | 11/1974 | Porawski | 328/143 |
| 3,959,717 | 5/1976 | Pitel | 323/22 Z |
| 4,138,612 | 2/1979 | Schlesinger | 307/237 |
| 4,155,059 | 5/1979 | Doi | 333/214 |
| 4,321,524 | 3/1982 | Petrovic | 323/229 |
| 4,360,746 | 11/1982 | Branson | 307/551 |

OTHER PUBLICATIONS

A. Crosier, "Negative Conductance Circuit", IBM Technical Disclosure Bulletin, vol. 15, No. 1, Jun. 1972, pp. 138–139.

V. A. Scotto, "Voltage Reference Circuit", IBM Technical Disclosure Bulletin, vol. 16, No. 4, Sep. 1973, p. 1101.

C. Morgan and H. Stirling, "Hybrid Zener Circuit", IBM Technical Disclosure Bulletin, vol. 16, No. 9, Feb. 1974, pp. 2908–2909.

David V. Kerns, Jr., "A Zener Diode Model for Computer Circuit Simulations", International Journal of Electronics, vol. 45, No. 4, 1978, pp. 417–424.

Primary Examiner—William M. Shoop
Assistant Examiner—Peter S. Wong
Attorney, Agent, or Firm—Neil F. Martin; Michael H. Jester; Edward B. Johnson

[57] ABSTRACT

A circuit which performs regulator or limiter functions at current and voltage levels below the operating ranges of conventional zener diodes. The output of an op amp is connected through a diode to a main input terminal which may be connected between a power source and one end of a load resistor. A first current limiting resistor connects the main input terminal to the inverting input of the op amp. A second current limiting resistor connects the non-inverting input of the op amp to the wiper terminal of a potentiometer which permits adjustment of a simulated zener voltage $V_z$. A pair of supply voltage terminals of the op amp are connected to voltages $V_{cc}$ and $V_{ee}$, respectively. A pair of fixed terminals of the potentiometer are also connected to voltages $V_{cc}$ and $V_{ee}$, respectively. The simulated zener voltage $V_z$ may be positive or negative, and may be adjusted to any value within limits determined by voltages $V_{cc}$ and $V_{ee}$, the op amp saturation voltages, the current sinking capability of the op amp, and the voltage drop across the diode.

10 Claims, 6 Drawing Figures

ACTIVE ZENER DIODE SUBSTITUTE

ACTIVE ZENER DIODE SUBSTITUTE CIRCUIT

ACKNOWLEDGEMENT

The Government has rights in this invention pursuant to Contract No. DAAK40-76-C-0658, awarded by the U.S. Army.

BACKGROUND OF THE INVENTION

The present invention relates to voltage reference and regulator circuits, and more particularly, to a circuit which actively simulates the performance of a zener diode and which is capable of regulating currents at very low levels or providing very low reference voltages.

Zener diodes are extensively utilized in simple voltage regulator circuits, reference voltage circuits, overvoltage protection circuits, signal clipping circuits, etc. A zener diode is a specially treated PN junction with a relatively low reverse breakdown voltage, for example less than five volts. When a source of voltage is applied to the zener diode in the reverse direction (anode negative), a reverse current develops. As the reverse voltage is increased, eventually a so-called "avalanche breakdown" condition occurs, resulting in a large increase in current for a small change in voltage. A zener diode presents the effect of a very low impedance and therefore maintains a fairly constant voltage over a large range of currents. The voltage at which the avalanche breakdown occurs is referred to as the zener voltage. Thus, the current-voltage curve of a zener diode exhibits a sharp knee at the zener voltage. Since the resistance of the zener diode drops drastically at this point, it is necessary to limit the current flow with an external resistor. Avalanche breakdown of an operating zener diode is not destructive as long as the rated power dissipation of the junction is not exceeded.

Physical limitations in the fabrication processes make it difficult to fabricate a zener diode to regulate on currents less than approximately one milliamp, or to maintain reference voltages less than approximately three volts. It would be desirable to provide a circuit for actively simulating the performance of a zener diode at low current levels and low voltage levels so that regulating and reference functions could be performed at these low levels.

SUMMARY OF THE INVENTION

Accordingly, it is the primary object of the present invention to provide a circuit for actively simulating the performance of a zener diode.

It is another object of the present invention to provide an active zener diode substitute circuit which will permit the regulation of currents substantially less than one milliamp, and which will permit reference voltages substantially less than three volts to be established.

Still another object of the present invention is to provide a circuit of the aforementioned type in which the simulated zener voltage may be varied.

Yet another object of the present invention is to provide a circuit of the aforementioned type in which the simulated zener voltage may be either positive or negative.

Another object of the present invention is to provide a circuit of the aforementioned type which will simulate the performance of a zener diode at microamp current levels.

The present invention provides a circuit which performs regulator or limiter functions at current and voltage levels below the operating ranges of conventional zener diodes. The output of an op amp is connected through a diode to a main input terminal which may be connected between a power source and one end of a load resistor. A first current limiting resistor connects the main input terminal to the inverting input of the op amp. A second current limiting resistor connects the non-inverting input of the op amp to the wiper terminal of a potentiometer which permits adjustment of a simulated zener voltage $V_z$. A pair of supply voltage terminals of the op amp are connected to voltages $V_{cc}$ and $V_{ee}$, respectively. A pair of fixed terminals of the potentiometer are also connected to voltages $V_{cc}$ and $V_{ee}$, respectively. The simulated zener voltage $V_z$ may be positive or negative, and may be adjusted to any value within limits determined by voltages $V_{cc}$ and $V_{ee}$, the op amp saturation voltages, the current sinking capability of the op amp, and the voltage drop across the diode.

DESCRIPTION OF THE PREFERRED EMBODIMENTS

Figure 1A:
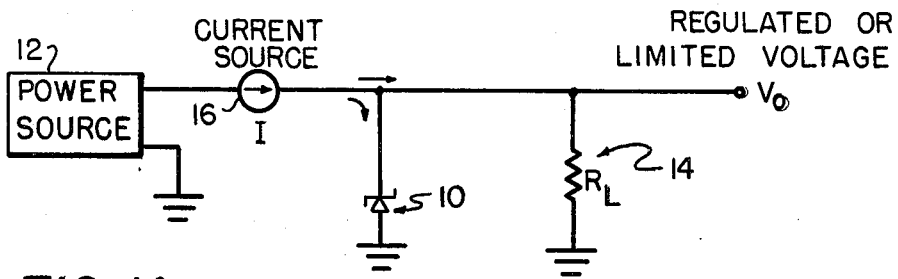
FIG. 1A is a schematic diagram illustrating the voltage regulation or limiting function of a conventional zener diode.
Figure 1B:
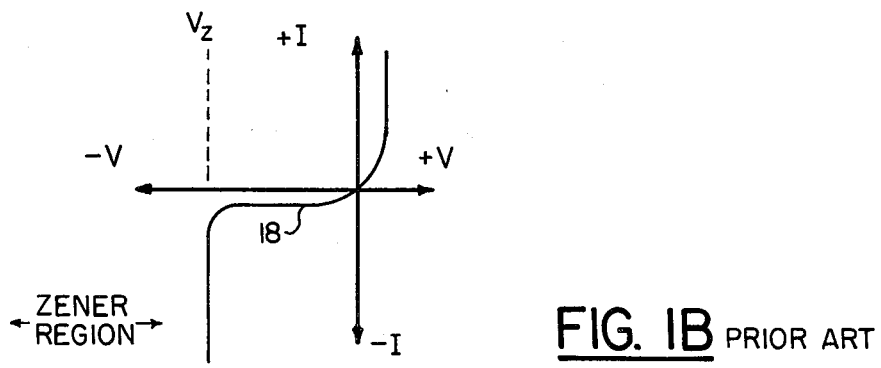
FIG. 1B is a current versus voltage graph illustrating the performance of a conventional zener diode.

The operation of a typical zener diode is illustrated in FIGS. 1A and 1B. The cathode end of a zener diode 10 is connected to a power source 12 and one end of a load resistor 14 designated as $R_L$. The anode end of the zener diode, the other side of the power source, and the other side of the load resistor $R_L$ are connected to ground. The current source 16 provided by the power source 12 forces current backward through the zener diode to bias the zener diode in its zener region. The reverse voltage across the zener diode 10 is seen from FIG. 1B to be nearly constant over a wide range of currents. The slope of the current versus voltage curve 18 in the zener region is $\Delta I/\Delta V$, which is a very large number. The reciprocal of the slope is the dynamic impedance, which is a very small number. The zener diode 10 therefore looks like a low-impedance voltage source, or a regulator.

If the resistance of the load resistor $R_L$ (FIG. 1A) varies, the total current will divide between $R_L$ and the zener diode in a manner that will keep the voltage $V_o$ nearly constant. If the resistance of the load resistor $R_L$ is so low that the load voltage is less than the zener voltage $V_z$ the zener diode essentially disappears. Thus, the circuit of FIG. 1A can function either as a regulator or as a limiter.

Figure 2A:
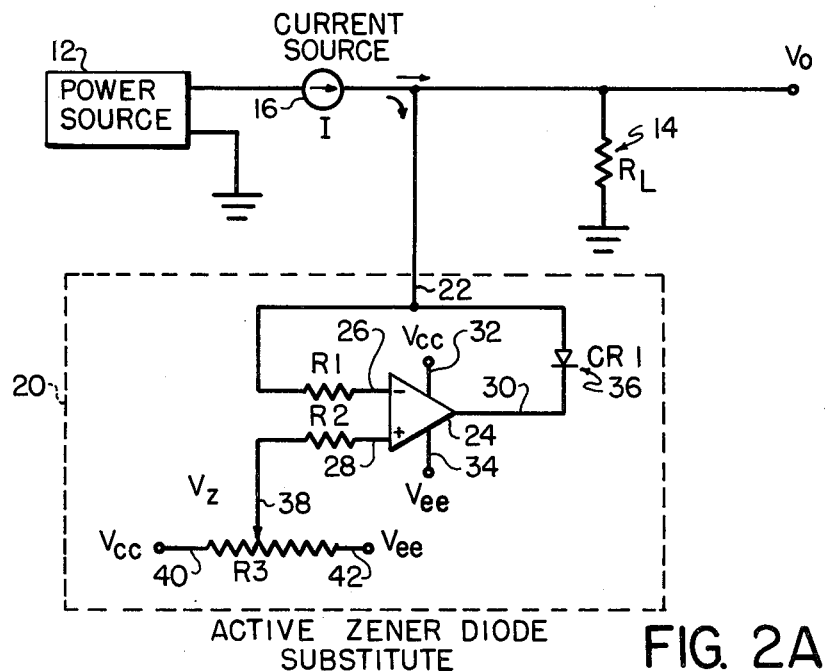
FIG. 2A is a schematic diagram of a first embodiment of the active zener diode substitute circuit of the present invention connected between a power source and one end of a load resistor.

FIG. 2A illustrates a first embodiment 20 of the active zener diode substitute circuit of the present invention which may be connected between a power source 12 and one end of a load resistor such as 14 in order to perform regulating and limiting functions at very low current and voltage levels. The active zener diode substitute circuit 20 has a main input terminal 22 connectable between the power source 12 and one end of the load resistor $R_L$ 14. The circuit 20 further includes an operational amplifier 24 (op amp) having an inverting input terminal 26, a non-inverting input terminal 28 and an output terminal 30. The op amp further includes a first supply voltage terminal 32 which is connectable to a source of a supply voltage $V_{cc}$ and a second supply voltage terminal 34 connectable to a source of a supply voltage $V_{ee}$. The active zener diode substitute circuit 20 further includes a conventional "non-zener" diode 36 designated CR1 in FIG. 2A. The diode CR1 is a standard PN junction diode. The anode of the diode CR1 is connected to the main input terminal 22. The cathode of the diode CR1 is connected to the output terminal 30 of the op amp 24.

Also included in the first embodiment 20 of the active zener diode substitute circuit (FIG. 2A) are current limiting resistors R1 and R2 and a potentiometer R3. One end of the resistor R1 is connected to the inverting input terminal 26 of the op amp and the other end of the resistor R1 is connected to the main input terminal 22. One end of the resistor R2 is connected to the non-inverting input terminal 28 of the op amp and the other end of the resistor R2 is connected to the wiper terminal 38 of the potentiometer R3. The potentiometer has a pair of first and second fixed terminals 40 and 42 which are connectable to the supply voltage sources $V_{cc}$ and $V_{ee}$, respectively.

Figure 2B:
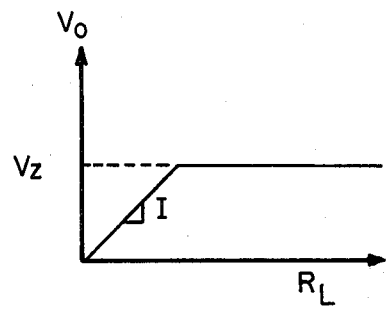
FIG. 2B is a voltage versus resistance graph illustrating the performance of the first embodiment of the active zener diode substitute circuit shown in FIG. 2A.

The operation of the first embodiment 20 of the active zener diode substitute circuit of FIG. 2A may now be described in conjunction with the graph of FIG. 2B. The potentiometer R3 is used to set the simulated zener voltage $V_z$, while the resistors R1 and R2 serve only to limit current flow. If $V_o$ is less than the simulated zener voltage $V_z$, the output of the operational amplifier 24 is highly positive. The diode CR1 is cut off, and no current is drawn from the current source 16. At this point the active zener diode substitute circuit 20 is essentially disconnected from the remainder of the circuit in FIG. 2A. If the resistance of the load resistor $R_L$ is increased above the ratio $V_o/I$, then $V_o$ will attempt to increase above the simulated zener voltage $V_z$. The output of the op amp 24 will then drop to $V_o-V_d$, where $V_d$ is the forward drop across the diode CR1, and the op amp will draw current through the diode CR1 and away from the load. This keeps the voltage $V_o$ from increasing above the simulated zener voltage $V_z$. The circuit 20 therefore functions as either a regulator or a limiter.

The simulated zener voltage $V_z$ may be any value within the limits set by the supply voltages $V_{cc}$ and $V_{ee}$, the saturation voltages of the op amp 24, the current "sinking" capability of the op amp and the voltage drop across the diode CR1. The zener voltage $V_z$ may be positive or negative. The latter case is useful when the load resistor $R_L$ is returned to a negative voltage, rather than to ground. The op amp is used in a high-gain configuration so that the low output impedance does not depend on careful control of the gain.

The active zener diode substitute circuit 20 will work with a current source I at a level in the microamp range. For very low current operation, the op amp 24 is preferably of the integrated circuit type having an input stage including a plurality of field effect transistors (FETs), so that bias currents are measured in microamps, nanoamps, or even picoamps.

Figure 3A:
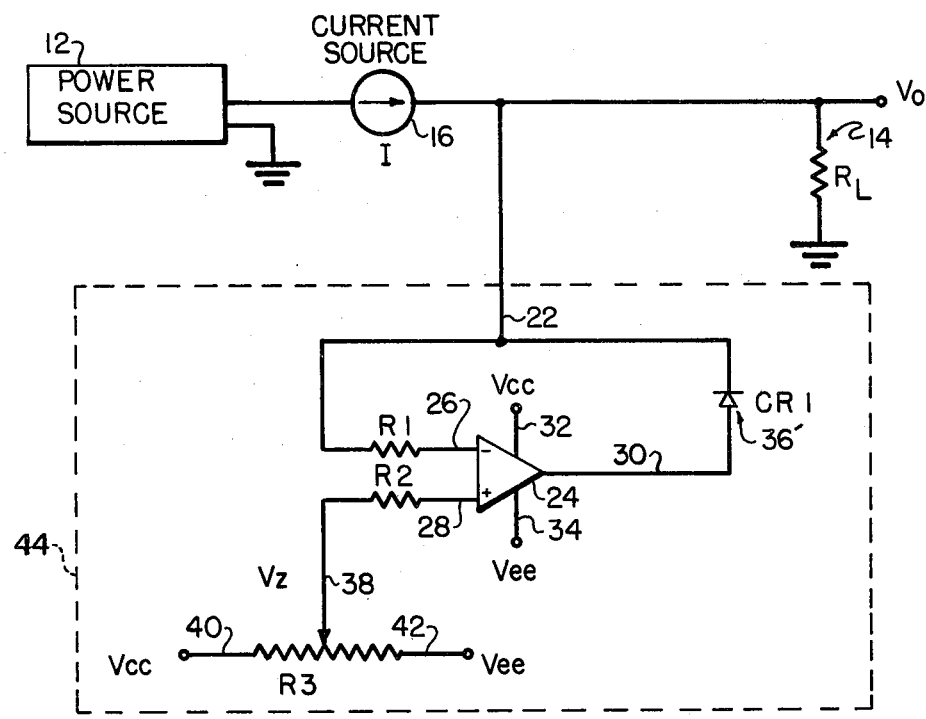
FIG. 3A is a schematic diagram of a second embodiment of the active zener diode substitute circuit of the present invention connected between a power source and one end of a load resistor.
Figure 3B:
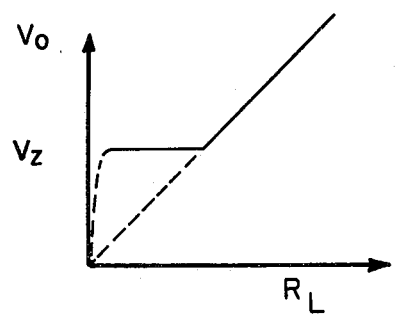
FIG. 3B is a voltage versus resistance graph illustrating the performance of the second embodiment of the active zener diode substitute circuit shown in FIG. 3A.

FIG. 3A illustrates a second embodiment 44 of the active zener diode substitute circuit of the present invention in which the diode CR1 is reversed as indicated by the reference numeral 36' so that the circuit will provide a limit to the negative excursion of a voltage. In addition to operating with either applied polarity, the substitute circuit will "clamp" either at the high or low end of the operating region. In this embodiment, the cathode of the diode 36' is connected to the main input terminal 22. The anode of the diode 36' is connected to the output terminal 30 of the op amp 24. In this configuration, the op amp serves as a current source, rather than a sink, and provides the current necessary to augment I to maintain the voltage across a small load resistor $R_L$. The operation of the second embodiment 44 of the active zener diode substitute is illustrated in the graph of FIG. 3B. Again, the performance of this substitute circuit is determined by the supply voltages $V_{cc}$ and $V_{ee}$, the saturation voltages of the op amp, the current capability of the op amp and the voltage drop across the diode 36'.

The circuits described above actively simulate the performance of a conventional zener diode at low voltage and current levels where conventional zener diodes cannot perform such regulating and limiting functions. The circuits illustrated in FIG. 2A and 3A do not include any conventional zener diodes.

Having described preferred embodiments of my active zener diode substitute circuit, modifications and adaptations of my invention will occur to those skilled in the art. Therefore, the protection afforded my invention should be limited only in accordance with the scope of the following claims.

I claim:
1. An active zener diode substitute circuit comprising:
a main input terminal connectable between a power source and one end of a load resistor;
an operational amplifier having an inverting input terminal, a non-inverting input terminal, an output terminal, a first supply voltage terminal connectable to a source of a supply voltage $V_{cc}$ and a second supply voltage terminal connectable to a source of a supply voltage $V_{ee}$;
a diode having an anode and a cathode and connected between the output terminal of the operational amplifier and the main input terminal;
a first resistor having one end connected to the inverting input terminal of the operational amplifier and another end connected to the main input terminal;
a second resistor having one end connected to the non-inverting input terminal of the operational amplifier; and
a potentiometer having a wiper terminal connected to the other end of the second resistor, a first fixed terminal connectable to the source of supply voltage $V_{cc}$ and a second fixed terminal connectable to the source of supply voltage $V_{ee}$.

2. A circuit according to claim 1 wherein the anode of the diode is connected to the main input terminal and the cathode of the diode is connected to the output terminal of the operational amplifier.

3. A circuit according to claim 1 wherein the cathode of the diode is connected to the main input terminal and the anode of the diode is connected to the output terminal of the operational amplifier.

4. A circuit according to claim 1 wherein the operational amplifier is an integrated circuit having an input stage including a plurality of field effect transistors.

5. A circuit according to claim 1 wherein the diode is a PN junction diode.

6. A circuit according to claim 1 wherein the diode has a breakdown voltage substantially above five volts.

7. A circuit according to claim 1 wherein the other end of the load resistor is connected to ground.

8. A circuit according to claim 1 wherein the other end of the load resistor is connected to a source of positive or negative voltage.

9. A circuit according to claim 1 wherein the operational amplifier, diode, first and second resistors, potentiometer, and supply voltages $V_{cc}$ and $V_{ee}$ are selected so that the circuit can regulate at a current level below one milliamp.

10. A circuit according to claim 1 wherein the operational amplifier, diode, first and second resistors, potentiometer, and supply voltages $V_{cc}$ and $V_{ee}$ are selected so that the circuit can supply a reference voltage less than three volts.

* * * * *